(12) United States Patent
Matsushima et al.

(10) Patent No.: US 11,261,540 B2
(45) Date of Patent: Mar. 1, 2022

(54) METHOD OF CONTROLLING CONVECTION PATTERNS OF SILICON MELT AND METHOD OF MANUFACTURING SILICON SINGLE CRYSTAL

(71) Applicant: SUMCO CORPORATION, Tokyo (JP)

(72) Inventors: Naoki Matsushima, Tokyo (JP); Ryusuke Yokoyama, Tokyo (JP); Hideki Sakamoto, Tokyo (JP); Wataru Sugimura, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 0 days.

(21) Appl. No.: 16/976,256

(22) PCT Filed: Feb. 27, 2019

(86) PCT No.: PCT/JP2019/007441
§ 371 (c)(1),
(2) Date: Aug. 27, 2020

(87) PCT Pub. No.: WO2019/167986
PCT Pub. Date: Sep. 6, 2019

(65) Prior Publication Data
US 2020/0407875 A1    Dec. 31, 2020

(30) Foreign Application Priority Data

Feb. 28, 2018 (JP) .............................. JP2018-035832

(51) Int. Cl.
*C30B 30/04* (2006.01)
*C30B 15/10* (2006.01)
(Continued)

(52) U.S. Cl.
CPC .............. *C30B 30/04* (2013.01); *C30B 15/10* (2013.01); *C30B 15/22* (2013.01); *C30B 15/30* (2013.01); *C30B 29/06* (2013.01)

(58) Field of Classification Search
CPC ......... C30B 15/10; C30B 15/20; C30B 15/22; C30B 15/30; C30B 15/305; C30B 29/06; C30B 30/04
See application file for complete search history.

(56) References Cited

U.S. PATENT DOCUMENTS

2007/0022943 A1* 2/2007 Hong .................... C30B 15/305
117/30
2011/0214605 A1* 9/2011 Matsumoto ........... C30B 15/305
117/15

FOREIGN PATENT DOCUMENTS

CN    101319350 A    12/2008
CN    107407003 A    11/2017
(Continued)

OTHER PUBLICATIONS

Official Communication issued in International Bureau of WIPO Patent Application No. PCT/JP2019/007441, dated Apr. 16, 2019.
(Continued)

*Primary Examiner* — Matthew J Song
(74) *Attorney, Agent, or Firm* — Greenblum & Bernstein, P.L.C.

(57) ABSTRACT

A method of controlling a convection pattern of a silicon melt includes applying a horizontal magnetic field having an intensity of 0.2 tesla or more to the silicon melt in a rotating quartz crucible to fix a direction of a convection flow in a plane orthogonal to an application direction of the horizontal magnetic field in the silicon melt, the horizontal magnetic field being applied so that a central magnetic field line passes through a point horizontally offset from a center axis of the quartz crucible by 10 mm or more.

4 Claims, 8 Drawing Sheets

Figure 1:
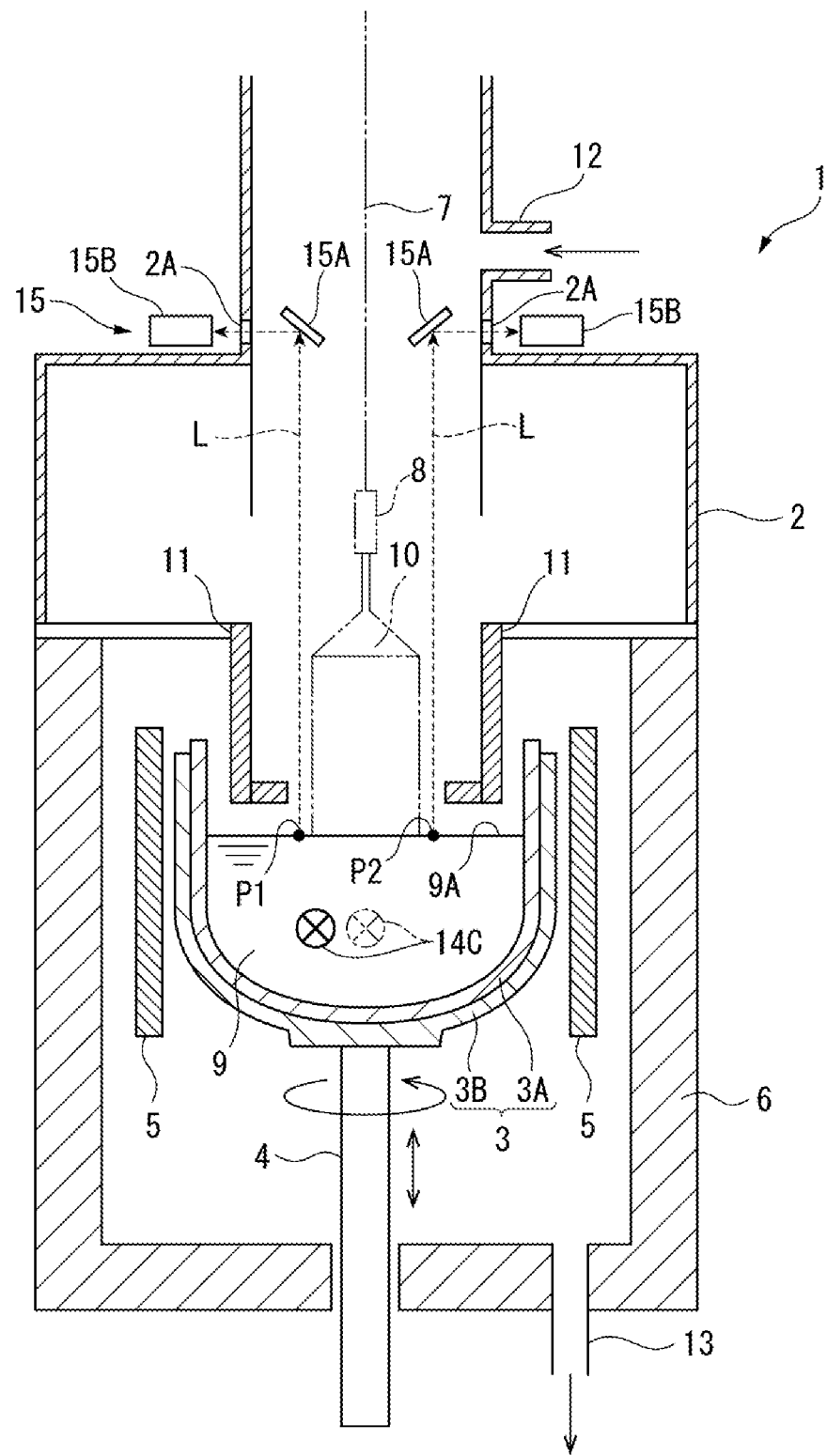

(51) Int. Cl.
*C30B 15/22* (2006.01)
*C30B 15/30* (2006.01)
*C30B 29/06* (2006.01)

(56) References Cited

FOREIGN PATENT DOCUMENTS

| | | |
|---|---|---|
| JP | 2000-109390 | 4/2000 |
| JP | 2001-89289 | 4/2001 |
| JP | 2010-132498 | 6/2010 |
| JP | 2015-124127 | 7/2015 |
| KR | 10-1611439 B1 | 4/2016 |

OTHER PUBLICATIONS

IPRP for PCT/JP2019/007441, dated Sep. 1, 2020.
Office Action for CN App. No. 201980015950.2, dated Jul. 28, 2021 (w/ translation).
Office Action for KR App. No. 10-2020-7024681, dated Oct. 29, 2021 (w/ translation).

* cited by examiner

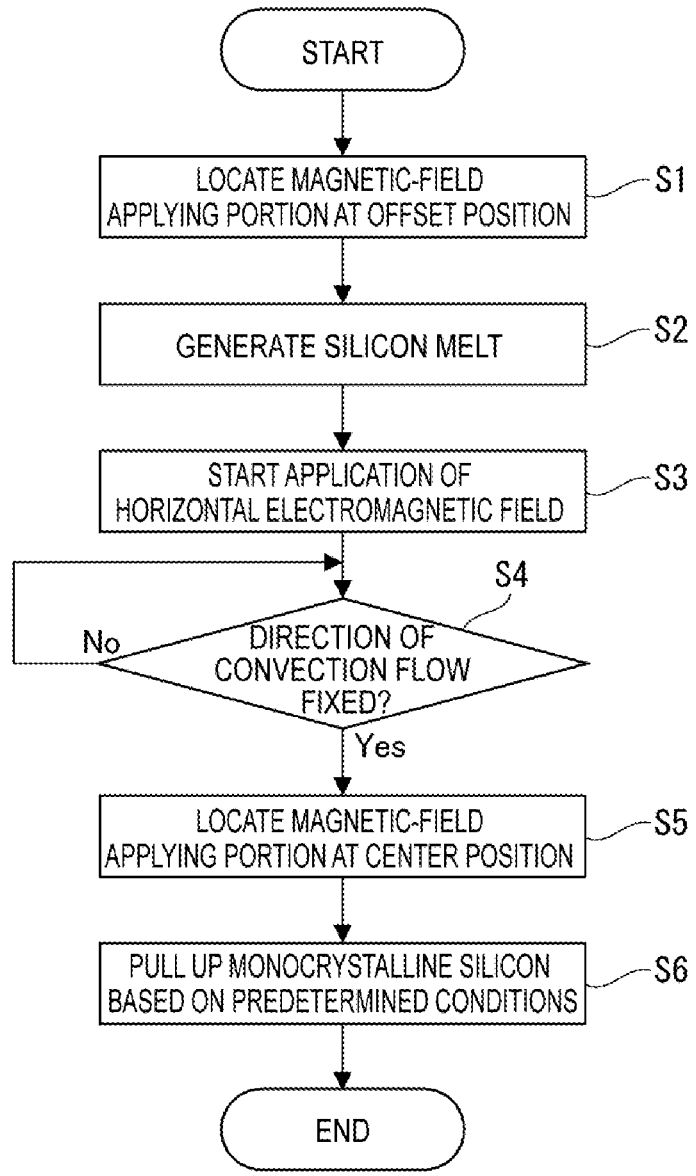

METHOD OF CONTROLLING CONVECTION PATTERNS OF SILICON MELT AND METHOD OF MANUFACTURING SILICON SINGLE CRYSTAL

TECHNICAL FIELD

The present invention relates to a method for controlling a convection pattern of a silicon melt and a method for manufacturing monocrystalline silicon.

BACKGROUND ART

A method called Czochralski method (hereinafter, referred to as CZ method) is used for manufacturing monocrystalline silicon. In such a manufacturing process using the CZ method, various studies have been made for controlling an oxygen concentration in monocrystalline silicon (see, for instance, Patent Literature 1).

Patent literature 1 discloses that the oxygen concentration in monocrystalline silicon can be controlled by horizontally offsetting a center position of a horizontal magnetic field with respect to a pull-up shaft for monocrystalline silicon by 2 to 14 mm in a period before and/or after pulling up the monocrystalline silicon.

CITATION LIST

Patent Literature(S)

Patent Literature 1 JP 2010-132498 A

SUMMARY OF THE INVENTION

Problem(s) to be Solved by the Invention

However, the oxygen concentration still sometimes varies in each of ingots of monocrystalline silicon even when such a method as that of Patent Literature 1 is used.

An object of the invention is to provide a method for controlling a convection pattern of a silicon melt and a manufacturing method of monocrystalline silicon capable of restraining a variation in an oxygen concentration in each of ingots of monocrystalline silicon.

Means for Solving the Problem(s)

A method of controlling a convection pattern of a silicon melt according to an aspect of the invention is used for manufacturing monocrystalline silicon, the method including applying a horizontal magnetic field having an intensity of 0.2 tesla or more to the silicon melt in a rotating quartz crucible, in which the horizontal magnetic field is applied so that a central magnetic field line passes through a point horizontally offset from a center axis of the quartz crucible by 10 mm or more to fix a direction of a convection flow in the silicon melt in a plane orthogonal to a direction in which the horizontal magnetic field is applied.

When the horizontal magnetic field is not applied to the silicon melt, a downward flow, which once rises from an outer part of the silicon melt and then flows downward at a central part of the silicon melt, is generated in the silicon melt. When the quartz crucible is rotated in this state, the downward flow is shifted to a position offset from the rotation center and rotates in a rotation direction of the quartz crucible as viewed from above the quartz crucible. When the horizontal magnetic field whose intensity is 0.01 tesla is applied so that the horizontal magnetic field passes through a center axis of the quartz crucible in this state, the rotation of the downward flow as viewed from above is restrained. Then, when the magnetic field intensity is further raised, a change occurs in magnitudes of the convection flows in rising directions on the right and left sides of the downward flow in a plane (a plane orthogonal to the direction in which the horizontal magnetic field is applied in the silicon melt (hereinafter, referred to as a "field-orthogonal cross-section")). When the magnetic field intensity reaches 0.2 tesla, one of the convection flows disappears at any region in the silicon melt in the application direction, where a clockwise or anticlockwise convection flow only remains. When the convection flow is fixed clockwise in the field-orthogonal cross-section, the temperature of the silicon melt becomes higher on the left side than on the right side. When the convection flow is fixed anticlockwise, the temperature of the silicon melt becomes higher on the right side than on the left side.

When the horizontal magnetic field is applied so that the central magnetic field line passes through a center axis of the quartz crucible, the convection flow is fixed clockwise or anticlockwise. However, with the horizontal magnetic field being applied to pass through the point horizontally offset from the center axis of the quartz crucible by 10 mm or more, the likelihood of the unidirectional fixation of the direction of the convection flow can be enhanced irrespective of the timing for applying the horizontal agnetic field. For instance, with the central magnetic field line passing through the right side of the center axis of the quartz crucible in the field-orthogonal cross-section, the convection flow can be fixed anticlockwise. With the central magnetic field line passing through the left side of the center axis in the field-orthogonal cross-section, the convection flow can be fixed clockwise.

Since the pull-up device of monocrystalline silicon, which is symmetrically designed, is not strictly symmetric with regard to the components thereof, a thermal environment in the chamber is also sometimes not symmetric.

For instance, when the convection flow is fixed clockwise in a pull-up device having such a thermal environment that the quartz crucible has a higher temperature on the left side than on the right side in the field-orthogonal cross-section, since the left side of the silicon melt in the clockwise convection flow becomes higher in temperature, the temperature on the left side of the silicon melt becomes higher in synergy with the thermal environment. In contrast, when the convection flow is fixed anticlockwise, the synergistic effect with the thermal environment as in the clockwise convection flow does not occur and the left side of the silicon melt does not become so high in temperature.

Since an amount of oxygen eluted from the quartz crucible increases as the temperature of the silicon melt becomes higher, when the pull-up device having the above-described thermal environment is used for pulling up the monocrystalline silicon, the amount of oxygen caught in the monocrystalline silicon when the convection flow is fixed clockwise is increased to raise the oxygen concentration in the straight body with respect to the convection flow that is fixed anticlockwise.

Patent Literature 1 does not disclose that the monocrystalline silicon is pulled up after the direction of the convection flow is unidirectionally fixed based on a pass-through position of the central magnetic field line (i.e. the position for the central magnetic field line to pass through) of the horizontal magnetic field and the center axis of the quartz crucible. Accordingly, the direction of the convection flow at the time of starting the pull-up process, which is fixed clockwise in some instances, anticlockwise in other instances, or not unidirectionally fixed depending on each monocrystalline silicon to be produced, may cause variation in the oxygen concentration.

According to the above aspect of the invention, the pass-through position of the central magnetic field line is horizontally offset by 10 mm or more from the center axis of the quartz crucible to enhance the likelihood of the occurrence of the unidirectional fixation of the direction of the convection flow in the field-orthogonal cross-section, thereby restraining variation in the oxygen concentration depending on each monocrystalline silicon.

In the method of controlling a convection pattern of a silicon melt according to the above aspect of the invention, it is preferable that the point through which the central magnetic field line passes when the horizontal magnetic field is applied is offset from the center axis of the quartz crucible by 15 mm or more.

With this arrangement, the direction of the convection flow can be securely unidirectionally fixed.

In the method of controlling a convection pattern of a silicon melt according to the above aspect of the invention, it is preferable that the applying of the horizontal magnetic field includes a first fixing process for fixing the direction of the convection flow clockwise or a second fixing process for fixing the direction of the convection flow anticlockwise as viewed in a negative direction of a Y axis, the point for the central magnetic field line to pass through in the first fixing process being offset from the center axis of the quartz crucible in a negative direction in an X axis and the point for the central magnetic field line to pass through in the second fixing process being offset in a positive direction in the X axis, the X axis and Y axis being defined in a right-handed XYZ Cartesian coordinate system defining an intersection of the center axis of the quartz crucible and a center of a surface of the silicon melt as an origin, a vertically upward direction as a positive direction of a Z axis, and a direction in which the horizontal magnetic field is applied as a positive direction of the Y axis.

A manufacturing method of monocrystalline silicon according to another aspect of the invention includes: conducting the above-described method of controlling a convection pattern of a silicon melt; and pulling up the monocrystalline silicon while an intensity of the horizontal magnetic field is kept at 0.2 tesla or more.

In the manufacturing method of monocrystalline silicon according to the above aspect of the invention, it is preferable that, after conducting the method of controlling a convection pattern controlling method of a silicon melt, an application state of the horizontal magnetic field is adjusted so that the central magnetic field line passes through the center axis of the quartz crucible before the monocrystalline silicon is pulled up.

In a typical pull-up process of monocrystalline silicon, the horizontal magnetic field is applied so that the central magnetic field line passes through the center axis of the quartz crucible. Accordingly, in order to pull up monocrystalline silicon while the pass-through position of the central magnetic field line is kept offset from the center axis of the quartz crucible, new pull-up conditions have to be established in order to keep the quality (e.g. oxygen concentration) of the monocrystalline silicon.

According to the above aspect of the invention, the pass-through position of the central magnetic field line, which is offset from the center axis of the quartz crucible until starting the pull-up process of the monocrystalline silicon, is aligned with the center axis of the quartz crucible at the start of the pull-up process. Accordingly, typical pull-up conditions can be directly applied.

In the manufacturing method of monocrystalline silicon according to the above aspect of the invention, it is preferable that the monocrystalline silicon is pulled up after conducting the method of controlling a convection pattern of a silicon melt and the direction of the convection flow is determined to be fixed.

With the direction of the convection flow fixed opposite to a desired direction, a desired level of oxygen concentration cannot be achieved. According to the above arrangement, monocrystalline silicon having desired oxygen concentration can be provided by checking whether the convection flow of a desired direction is established before pulling up the monocrystalline silicon.

BRIEF DESCRIPTION OF DRAWING(S)

FIG. 1 schematically shows an arrangement of a pull-up device according to an exemplary embodiment of the invention.

Figure 2:
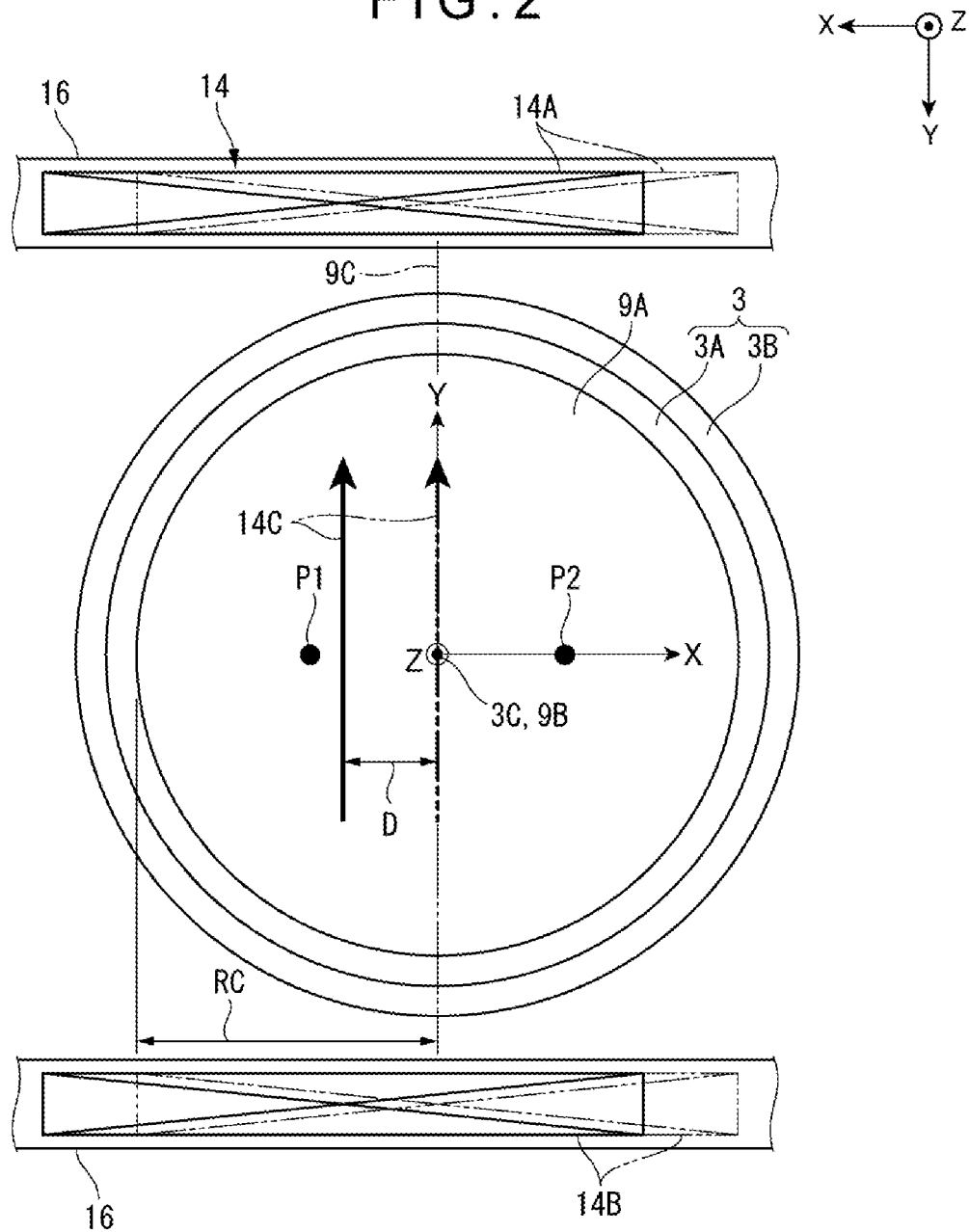

FIG. 2 schematically shows how a horizontal magnetic field is applied and positions of measurement points in the exemplary embodiment.

Figure 3:
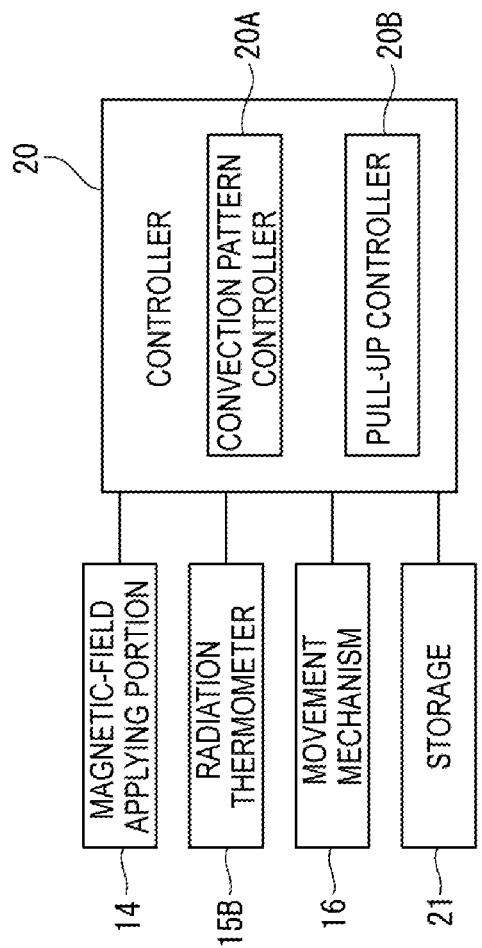

FIG. 3 is a block diagram showing a relevant part of the pull-up device in the exemplary embodiment.

Figure 4A:
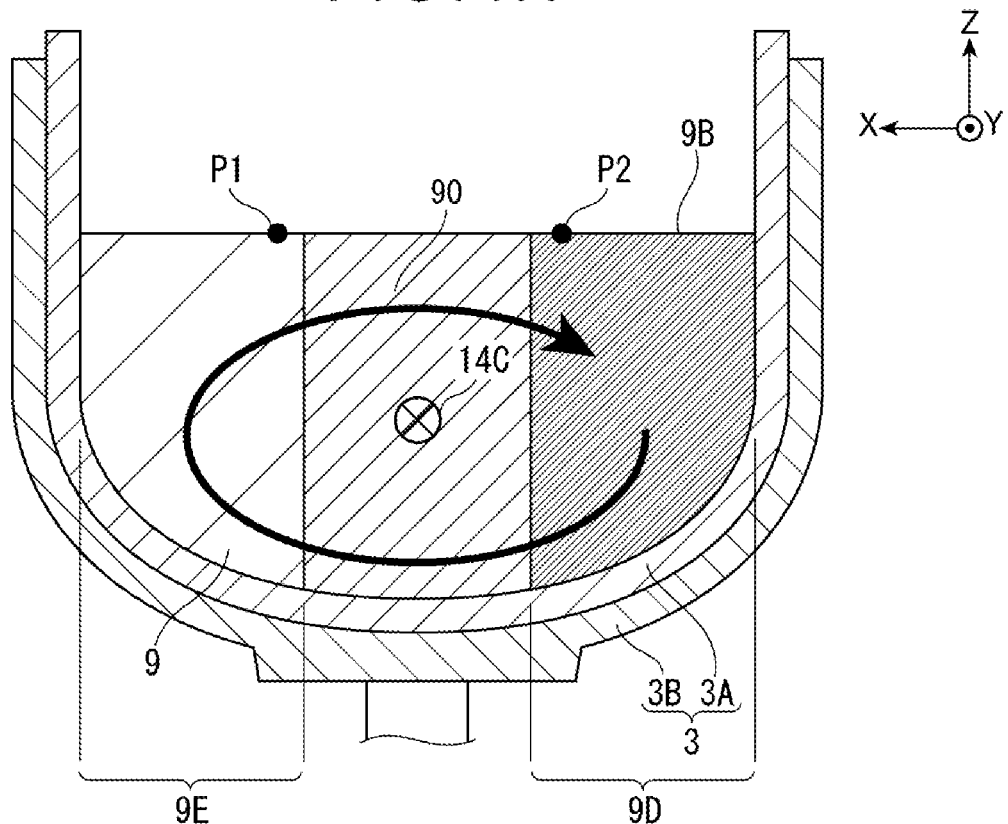

FIG. 4A schematically shows a relationship between an application direction of the horizontal magnetic field and a direction of a convection flow in a silicon melt in the exemplary embodiment, showing a clockwise convection flow.

Figure 4B:
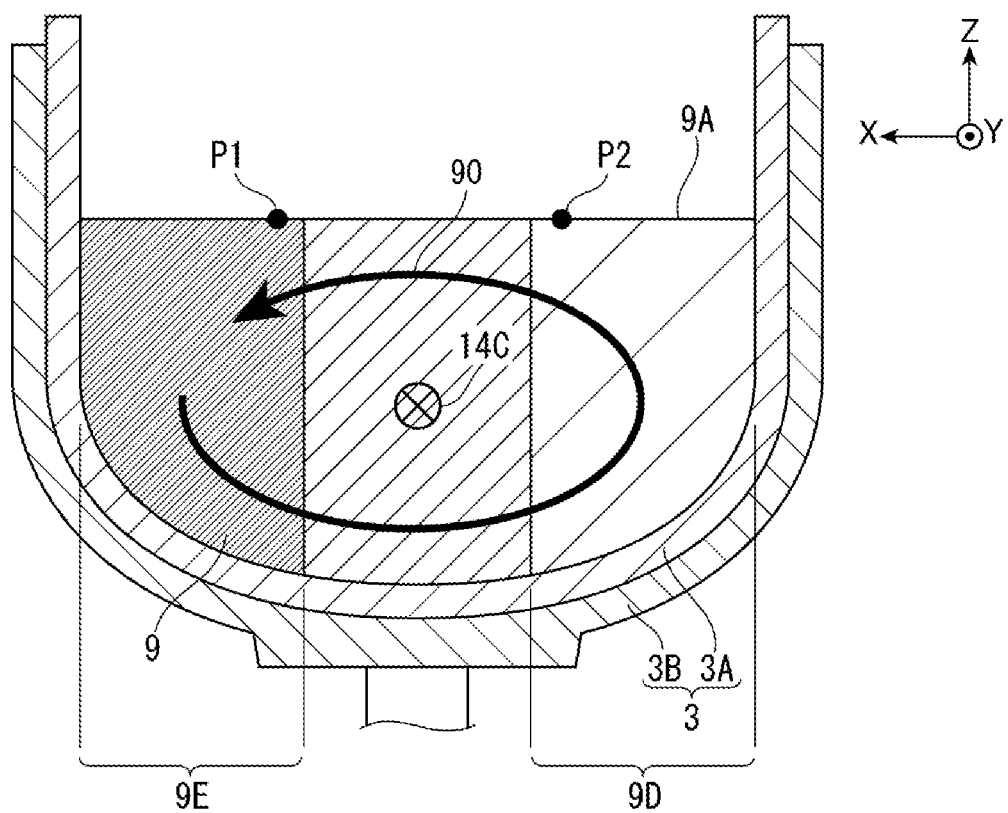

FIG. 4B schematically shows a relationship between the application direction of the horizontal magnetic field and the direction of the convection flow in the silicon melt in the exemplary embodiment, showing an anticlockwise convection flow.

Figure 5:
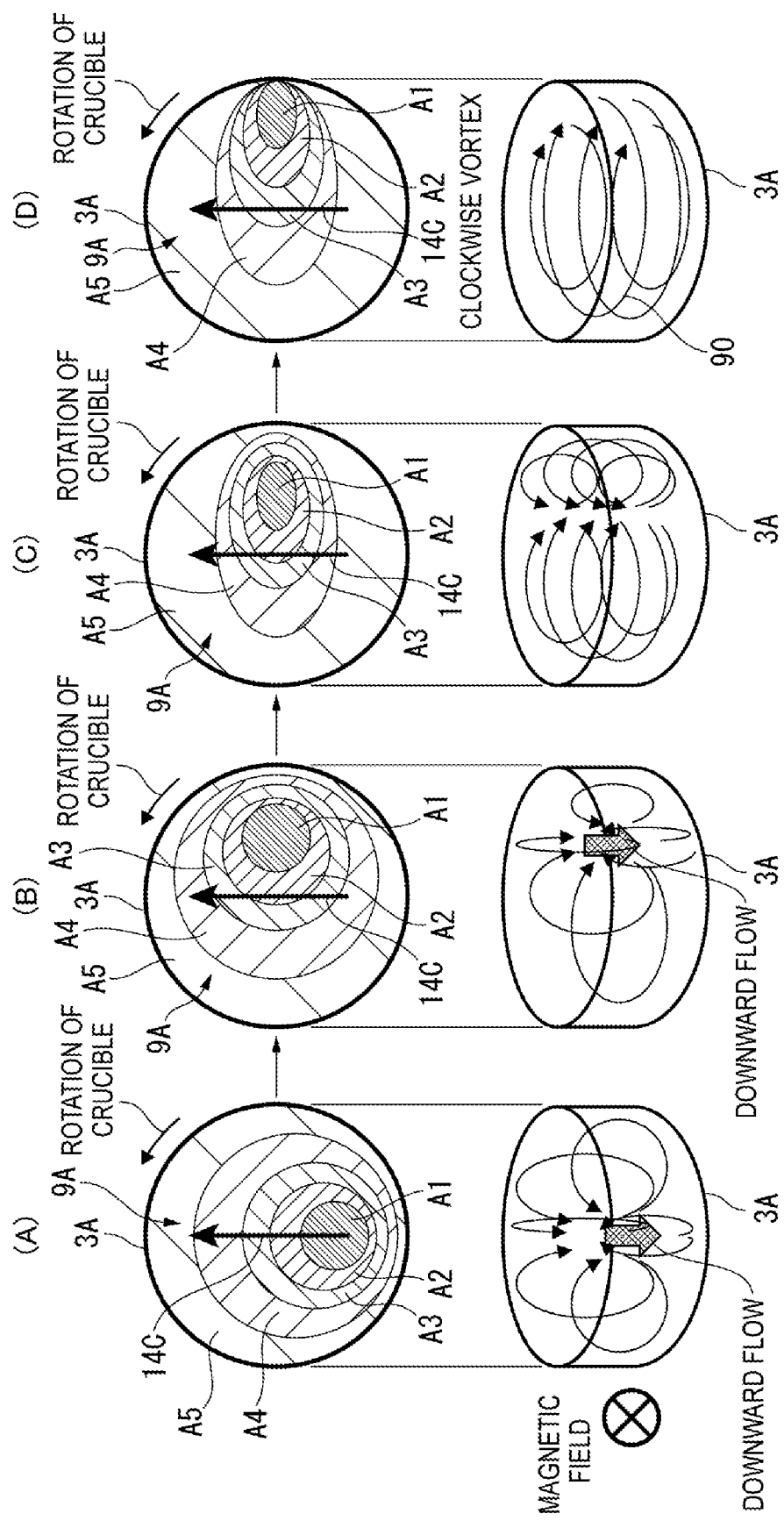

FIG. 5 schematically shows a change in the convection flow in the silicon melt in the exemplary embodiment.

Figure 6:
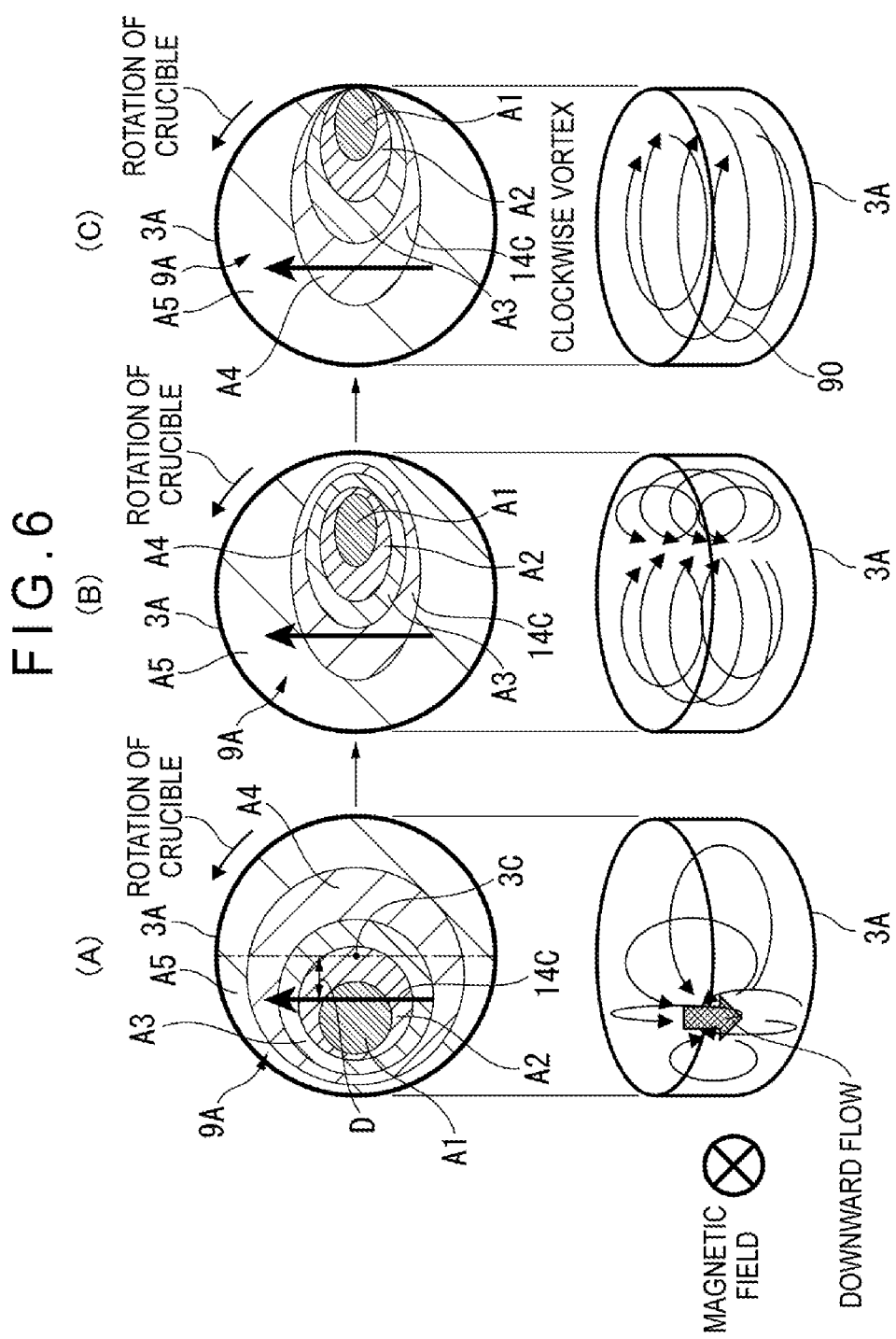

FIG. 6 schematically shows a relationship between an offset direction of a central magnetic field line and a fixing direction of the convection flow in the exemplary embodiment.

Figure 7:
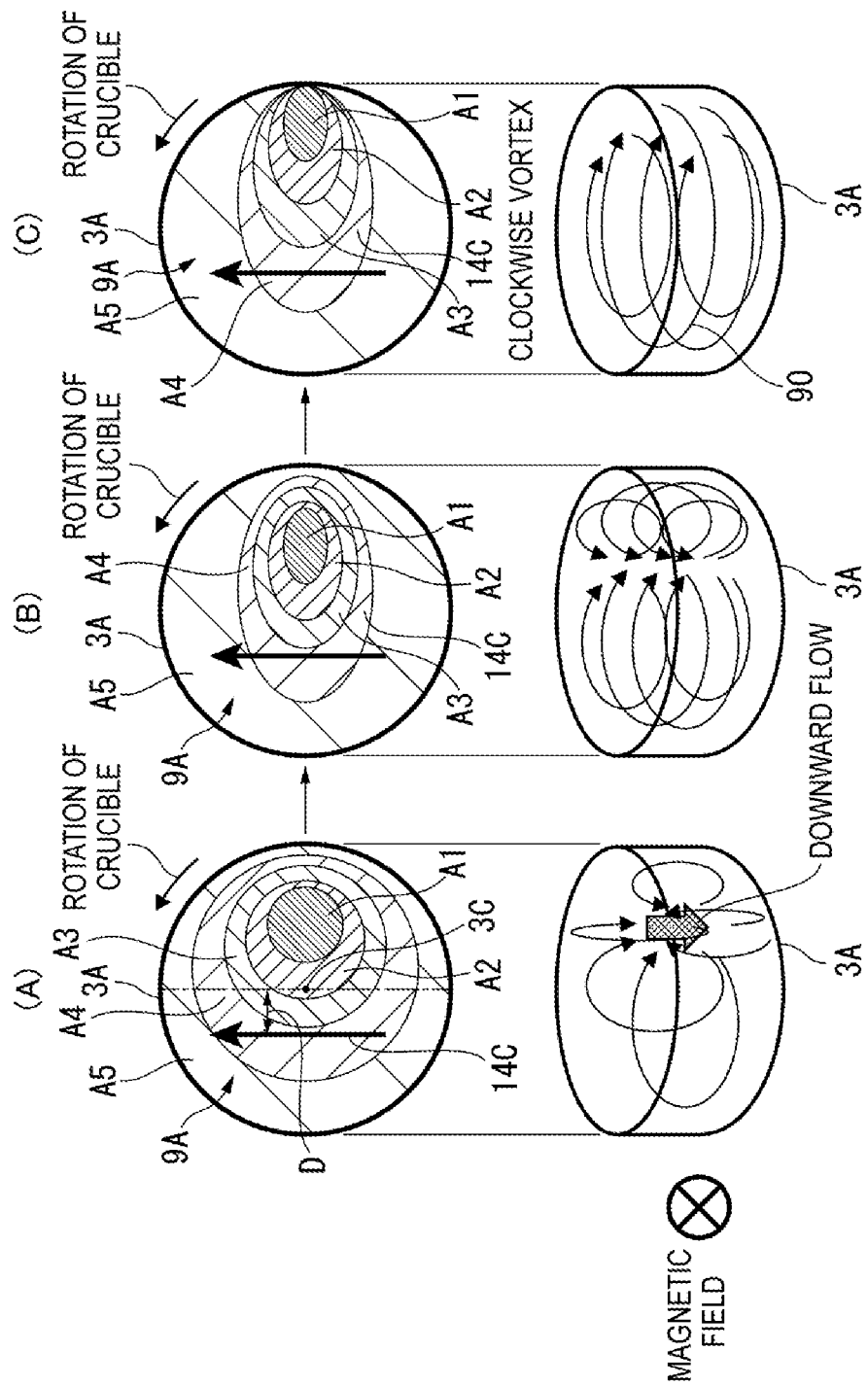

FIG. 7 schematically shows the relationship between the offset direction of the central magnetic field line and the fixing direction of the convection flow in the exemplary embodiment.

FIG. 8 is a flowchart showing a manufacturing method of monocrystalline silicon in the exemplary embodiment.

DESCRIPTION OF EMBODIMENT(S)

Exemplary embodiments of the invention will be described below with reference to the attached drawings.

1. Exemplary Embodiment

FIG. 1 schematically illustrates an exemplary structure of a pull-up device 1 of monocrystalline silicon to which a manufacturing method of monocrystalline silicon 10 according to an exemplary embodiment of the invention is applicable. The pull-up device 1, which is a device for pulling up the monocrystalline silicon 10 through the Czochralski method, includes a chamber 2 forming an outer shell and a crucible 3 disposed at the center of the chamber 2.

The crucible 3, which has a double structure of an inner quartz crucible 3A and an outer graphite crucible 3B, is fixed to an upper end of a support shaft 4 that is rotatable and movable up and down.

A resistance heating type heater 5 is provided outside the crucible 3 in a manner to surround the crucible 3. A heat insulation material 6 is provided outside the heater 5 and along an inner surface of the chamber 2.

A pull-up shaft 7 (e.g., a wire), which is coaxial with the support shaft 4 and configured to rotate at a predetermined speed in a direction opposite to or the same as the rotation direction of the support shaft 4, is provided above the crucible 3. A seed crystal 8 is attached to a lower end of the pull-up shaft 7.

A hollow cylindrical heat shield 11, which surrounds the growing monocrystalline silicon 10, is disposed in the chamber 2 at a part above a silicon melt 9 in the crucible 3.

The heat shield 11, which shields the growing monocrystalline silicon 10 from high-temperature radiation heat from the silicon melt 9 in the crucible 3, the heater 5 and a side wall of the crucible 3, prevents outward heat diffusion from a solid-liquid interface (i.e. an interface on which crystal grows) and a vicinity thereof, whereby the heat shield 11 serves to control a temperature gradient of a central portion and an outer peripheral portion of the monocrystalline silicon in a direction of the pull-up shaft.

A gas inlet 12, through which an inert gas (e.g. Argon gas) is introduced into the chamber 2, is provided at an upper part of the chamber 2. An exhaust outlet 13, through which the gas in the chamber 2 is sucked and discharged when a vacuum pump (not shown) is driven, is provided at a lower part of the chamber 2.

The inert gas introduced in the chamber 2 through the gas inlet 12, which flows downward between the growing monocrystalline silicon 10 and the heat shield 11 and then flows into a space between a lower end of the heat shield 11 and a liquid surface of the silicon melt 9, flows toward an outside of the heat shield 11 and an outside of the crucible 3 and then downward along the outside of the crucible 3, to be discharged from the exhaust outlet 13.

The pull-up device 1 also includes a magnetic-field applying portion 14, a temperature sensor 15, and a movement mechanism 16 as shown in FIG. 2.

The magnetic-field applying portion 14 includes a first magnetic body 14A and a second magnetic body 14B each in a form of a solenoid coil. The first and second magnetic bodies 14A and 14B are provided outside the chamber 2 in a manner to face each other across the crucible 3. The magnetic-field applying portion 14 preferably applies a horizontal magnetic field such that a central magnetic field line 14C passes through a center axis 3C of a quartz crucible 3A and the central magnetic field line 14C is directed in a top direction in FIG. 2 (i.e., a direction from a nearby side to a far side on a paper in FIG. 1). A height of the central magnetic field line 14C, which is not particularly limited, may be determined such that the central magnetic field line 14C passes through an inside or an outside of the silicon melt 9 depending on the quality of the monocrystalline silicon 10.

The temperature sensor 15 measures temperatures at a first measurement point P1 and a second measurement point P2 on a surface 9A of the silicon melt 9, the first and second measurement points being positioned across an imaginary line 9C that passes through a center 9B of the surface 9A and is in parallel with the central magnetic field line 14C of the horizontal magnetic field, as shown in FIGS. 1 to 2. It should be noted that a linear line connecting the first and second measurement points P1, P2 sometimes passes through the center 9B of the surface 9A, sometimes not.

The temperature sensor 15 includes a pair of reflectors 15A and a pair of radiation thermometers 15B.

The reflectors 15A are provided inside the chamber 2. The reflectors 15A are each preferably in a form of a silicon mirror having a mirror-polished surface as a reflection surface.

The radiation thermometers 15B are provided outside the chamber 2. The radiation thermometers 15B receive the radiation light L incident through quartz windows 2A provided to the chamber 2 and measure the temperatures at the first and second measurement points P1, P2 in a non-contact manner.

The movement mechanism 16 is configured to move the magnetic-field applying portion 14 between a center position (i.e. a position at which the central magnetic field line 14C passes through the center axis 3C of the quartz crucible 3A as shown in chain double-dashed lines in FIG. 2) and an offset position (i.e. a position at which the central magnetic field line 14C passes through a point horizontally (right/leftward in FIG. 2) offset from the center axis 3C of the quartz crucible 3A as shown in solid lines in FIG. 2). In other words, the movement mechanism 16 is configured to move the magnetic-field applying portion 14 so that the central magnetic field line 14C passes through the point offset in positive or negative direction of an X axis with respect to the center axis 3C in a right-handed XYZ Cartesian coordinate system defining an intersection of the center axis 3C of the quartz crucible 3A and the center 9B of the surface 9A of the silicon melt 9 as an origin, a vertically upward direction as a positive direction of a Z axis, and an application direction (i.e. a direction in which the horizontal magnetic field is applied) as a positive direction of a Y axis.

The movement mechanism 16 preferably moves the magnetic-field applying portion 14 so that a formula (1) below, or more preferably a formula (2) below, is satisfied, where an offset of the pass-through position of the central magnetic field line 14C with respect to the center axis 3C of the quartz crucible 3A is D (mm) and an inner radius of the quartz crucible 3A is RC (mm).

$$10 \text{ mm} \leq D < RC \tag{1}$$

$$15 \text{ mm} \leq D < RC \tag{2}$$

The movement mechanism 16, whose structure is not specifically limited as long as the movement mechanism 16 is capable of moving the magnetic-field applying portion 14, exemplarily includes sliders attached in one-to-one relationship to the first and second magnetic bodies 14A, 14B, slider guides configured to guide the respective sliders, and a drive unit for moving the first and second magnetic bodies 14A, 14B.

Moreover, the pull-up device 1 includes a controller 20 and a storage 21 as shown in FIG. 3.

The controller 20 includes a convection pattern controller 20A and a pull-up controller 20B.

The convection pattern controller 20A is configured to adjust the position of the central magnetic field line 14C of the horizontal magnetic field to fix the direction of the convection flow 90 (see FIGS. 4A and 4B) in the field-orthogonal cross-section (the plane orthogonal to the application direction of the horizontal magnetic field) of the silicon melt 9 to a predetermined direction.

The pull-up controller 20B pulls up the monocrystalline silicon 10 after the convection pattern controller 20A fixes the direction of the convection flow 90.

2. Background for Invention

The inventors have known that, even if the monocrystalline silicon 10 is pulled up using the same pull-up device 1 under the same pull-up conditions, an oxygen concentration of the pulled-up monocrystalline silicon 10 may sometimes become high or low. In order to solve this problem, a research has been typically focused on the pull-up conditions and the like. However, no definitive solution has been found.

After further research, the inventors have found that, when a solid polycrystalline silicon feedstock is put into the quartz crucible 3A to be dissolved therein and a horizontal magnetic field is applied so that the central magnetic field line 14C passes through the center axis 3C of the quartz crucible 3A using the magnetic-field applying portion 14 located at the center position as shown in the chain double-dashed lines in FIG. 2, the convection flow 90 rotating in a direction from the bottom of the quartz crucible 3A toward the surface 9A of the silicon melt 9 around magnetic field lines of the horizontal magnetic field is observed in the field-orthogonal cross-section (i.e., the cross-sectional plane viewed from the second magnetic body 14B (from the nearby side of the sheet of FIG. 1)). The rotation direction of the convection flow 90 is shown in two convection patterns of a case where a clockwise rotation is dominant as shown in FIG. 4A and a case where an anticlockwise rotation is dominant as shown in FIG. 4B.

The inventors have speculated that the occurrence of such a phenomenon is due to the following mechanism.

First, in a state where the horizontal magnetic field is not applied and the quartz crucible 3A is not rotated, the silicon melt 9 is heated in the vicinity of an outer periphery of the quartz crucible 3A, a convection flow occurs in an ascending direction from the bottom of the silicon melt 9 toward the surface 9A. The ascending silicon melt 9 is cooled at the surface 9A of the silicon melt 9, returns to the bottom of the quartz crucible 3A at the center of the quartz crucible 3A, so that a convection flow occurs in a descending direction.

When the convection flow that ascends in the outer periphery of the outer periphery and descends at the center thereof occurs, a position of the downward flow randomly shifts to be offset from the center due to instability of thermal convection. Such a downward flow is generated by a temperature distribution in which the temperature at a part of the surface 9A of the silicon melt 9 corresponding to the downward flow is the lowest and the temperature gradually increases toward an outer part of the surface 9A. For instance, in a state of FIG. 5(A), a temperature of a first region A1 whose center is offset from the rotation center of the quartz crucible 3A is the lowest, and temperatures of a second region A2, a third region A3, a fourth region A4 and a fifth region A5 which are sequentially located outside of the first region A1 become higher in this order.

In the state of FIG. 5(A), when the horizontal magnetic field whose central magnetic field line 14C passes through the center axis 3C of the quartz crucible 3A is applied, rotation of the downward flow is gradually restrained as viewed from above the quartz crucible 3A, and is then restrained at a position offset from the position of the magnetic field line 14C at the center of the horizontal magnetic field as shown in FIG. 5(B).

It is considered that the rotation of the downward flow is restrained after an intensity of the horizontal magnetic field acting on the silicon melt 9 becomes larger than a specific strength. Accordingly, the rotation of the downward flow is not restrained immediately after the application of the horizontal magnetic field is started, but is restrained after a predetermined time has elapsed from the start of the application.

It is reported that a change in the flow inside the silicon melt 9 due to the application of the magnetic field is generally represented by a magnetic number M, which is a dimensionless number obtained by a formula (3) below (Jpn. J. Appl. Phys., Vol. 33 (1994) Part. 2 No. 4A, pp. L487-490).

Numerical Formula 1

$$M = \frac{\sigma B_0^2 h}{\rho v_0} \quad (3)$$

In the formula (3), σ represents an electric conductivity of the silicon melt 9, $B_0$ represents the applied magnetic flux density, h represents a depth of the silicon melt 9, ρ represents a density of the silicon melt 9, and $v_0$ represents an average flow velocity of the silicon melt 9 in the absence of the magnetic field.

In an exemplary embodiment, it has been found that the minimum value of the specific strength of the horizontal magnetic field in which the rotation of the downward flow is restrained is 0.01 tesla. Magnetic Number at 0.01 tesla is 1.904. Even with the amount of the silicon melt 9 and the diameter of the quartz crucible 3A different from those of the exemplary embodiment, it is considered that the restraining effect (braking effect) of the downward flow by the magnetic field occurs at least at the magnetic field strength (magnetic flux density) at which Magnetic Number is 1.904.

When the intensity of the horizontal magnetic field is further increased from the state shown in FIG. 5(B), the magnitude of the convection flow in the ascending direction on the right side and the left side of the downward flow changes as shown in FIG. 5 (C), where the upward convection flow on the left side of the downward flow becomes dominant.

Finally, when the magnetic field strength reaches 0.2 tesla or more, the convection flow in the ascending direction on the right side of the downward flow disappears as shown in FIG. 5(D), where the convection flow flows upward (i.e. in the ascending direction) on the left side and downward (i.e. in the descending direction) on the right side to create the clockwise convection flow 90. In the state of the clockwise convection flow 90, as shown in FIG. 4A, the temperature gradually rises from a right region 9D toward a left region 9E of the silicon melt 9 in the field-orthogonal cross-section.

In contrast, if a start position of the downward flow in FIG. 5(A) is shifted by 180 degrees in the rotation direction of the quartz crucible 3A, the downward flow is restrained at a position on the left side where a phase is shifted by 180 degrees from that in FIG. 5(C), resulting in the anticlockwise convection flow 90. In the state of the anticlockwise convection flow 90, as shown in FIG. 4B, the temperature is gradually decreased from the right region 9D toward the left region 9E of the silicon melt 9.

Such a clockwise or anticlockwise convection flow 90 of the silicon melt 9 is maintained unless the intensity of the horizontal magnetic field is set to less than 0.2 tesla.

Although the direction of the convection flow 90 is fixedly determined clockwise or anticlockwise depending on the state of the convection flow immediately before the horizontal magnetic field is applied, since a position of the downward flow move at random, it is difficult to control the state of the convection flow immediately before the horizontal magnetic field is applied. As a result of further studies, the inventors have found that the direction of the convection flow 90 can be fixed only either clockwise or anticlockwise by applying the horizontal magnetic field with the use of the magnetic-field applying portion 14 disposed at the offset position, irrespective of the timing of applying the horizontal magnetic field.

As shown in FIG. 6(A), the horizontal magnetic field is applied so that the central magnetic field line 14C passes through the point offset by an offset amount D with respect to the center axis 3C of the quartz crucible 3A at a timing when the first region A1 including the central portion of the downward flow, where the temperature is lowest, is at the left side as viewed from above. In this case, since the distance between the central magnetic field line 14C and an inner periphery of the quartz crucible 3A is longer at the right side than at the left side and the intensity of the magnetic field increases as the distance from the central magnetic field line 14C increases, the convection flow is more strongly restrained at the right side than at the left side. As a result, when the magnetic field intensity reaches 0.01 tesla in the state shown in FIG. 6(A), the rotation of the downward flow is fixed in this state and, when the magnetic field intensity is subsequently increased, due to an asymmetric nature of the restraining effect of the convection flow, the first region A1 whose temperature is lowest gradually moves from the left side toward the right side of the center axis 3C as shown in FIG. 6(B), finally resulting in the convection flow 90 whose direction is fixed clockwise as shown in FIG. 6(C).

In another instance, as shown in FIG. 7(A), at a timing when the first region A1 is at the right side as viewed from above, the horizontal magnetic field is applied so that the central magnetic field line 14C passes through the point offset to the left in the same manner as in FIG. 6(A). In this case, since the distance between the central magnetic field line 14C and the inner periphery of the quartz crucible 3A is longer at the left side than at the right side, the convection flow is more strongly restrained at the left side than at the right side. As a result, when the magnetic field intensity reaches 0.01 tesla in the state shown in FIG. 7(A), the rotation of the downward flow is fixed in this state and, when the magnetic field intensity is subsequently increased, due to the asymmetric nature of the restraining effect of the convection flow, the first region A1 whose temperature is lowest gradually moves from the right side toward the left side of the center axis 3C as shown in FIG. 7(B), finally resulting in the convection flow 90 whose direction is fixed clockwise as shown in FIG. 7(C).

In other words, it is found that the direction of the convection flow 90 can be fixed clockwise irrespective of the timing for applying the horizontal magnetic field by performing a first fixing process of applying the horizontal magnetic field so that the central magnetic field line 14C passes through a point offset to the left side (in a negative direction of the X axis) with respect to the center axis 3C of the quartz crucible 3A.

Further, though not detailed herein, it is also found that the direction of the convection flow 90 can be fixed anticlockwise irrespective of the timing for applying the horizontal magnetic field by performing a second fixing process of applying the horizontal magnetic field so that the central magnetic field line 14C passes through a point offset to the right side (in a positive direction of the X axis) with respect to the center axis 3C of the quartz crucible 3A.

Further, since the pull-up device 1, which is symmetrically designed, is not actually symmetric, the thermal environment therein is also not symmetric. The asymmetry of the thermal environment is, for instance, attributable to the asymmetric shapes of the members such as the chamber 2, the crucible 3, the heater 5, and the heat shield 11, and the asymmetric installation positions of various components in the chamber 2.

For instance, in the field-orthogonal cross-section, the pull-up device 1 may create therein a thermal environment in which the temperature on the left side is higher than that on the right side of the quartz crucible 3A.

Under the thermal environment with the higher temperature on the left side than on the right side, when the convection flow 90 is fixed clockwise in the field-orthogonal cross-section, the left region 9E of the silicon melt 9 becomes higher in temperature due to the synergistic effect with the first thermal environment. Accordingly, the amount of oxygen eluted from the quartz crucible 3A increases. In contrast, when the convection flow 90 is fixed anticlockwise, the synergistic effect with the thermal environment as in the case of the clockwise rotation does not occur and the left region 9E does not become so high in temperature. Accordingly, the amount of oxygen eluted from the quartz crucible 3A becomes not so high as that in the clockwise convection flow 90.

Accordingly, under the thermal environment with higher temperature on the left side than on the right side, it is presumed that the oxygen concentration of the monocrystalline silicon 10 is high when the convection flow 90 is clockwise, and is not high (i.e. is low) when the convection flow 90 is anticlockwise.

Conversely, under the thermal environment with higher temperature on the right side than on the left side, it is presumed that the oxygen concentration of the monocrystalline silicon 10 is high when the convection flow 90 is anticlockwise, and is not high (i.e. is low) when the convection flow 90 is clockwise.

Based on the above, the inventors have reached an idea that the direction of the convection flow 90 of the silicon melt 9 can be unidirectionally fixed by applying the horizontal magnetic field so that the central magnetic field line 14C passes through the point horizontally offset from the center axis 3C of the quartz crucible 3A and, by thus fixing the direction of the convection flow, the variation in oxygen concentration depending on each monocrystalline silicon 10 can be restrained even when the thermal environment in the furnace of the pull-up device 1 is asymmetric.

[3] Manufacturing Method of Monocrystalline Silicon

Next, a manufacturing method of monocrystalline silicon in the exemplary embodiment will be described with reference to the flowchart shown in FIG. 8.

Firstly, for instance, with the central magnetic field line 14C being offset to the left side to fix the convection flow 90 clockwise, pull-up conditions (e.g., a flow rate of inert gas, an internal pressure of the chamber 2, and a rotation speed of the quartz crucible 3A) for achieving a desired value of the oxygen concentration of the monocrystalline silicon 10 are determined in advance as predetermined conditions, and the pull-up conditions are stored in the storage 21. The oxygen concentration of the predetermined condition may be values of the oxygen concentration at a plurality of points in the longitudinal direction of the straight body, or may be an average of the values of the oxygen concentration at the plurality of points.

Manufacturing of the monocrystalline silicon 10 is then started.

Initially, the convection pattern controller 20A controls the movement mechanism 16 to move the magnetic-field applying portion 14 to the offset position satisfying the formula (1), preferably the formula (2), as shown in FIG. 8 (Step S1). Then, while maintaining the inside of the chamber 2 in an inert gas atmosphere under reduced pressure, the pull-up controller 20B melts the solid material such as polycrystalline silicon filled in the crucible 3 with heat from the heater 5 to generate the silicon melt 9 (Step S2). Next, the pull-up controller 20B rotates the crucible 3 and the convection pattern controller 20A controls the magnetic-field applying portion 14 to start applying the horizontal magnetic field whose strength is 0.2 tesla or more to the silicon melt 9 (Step S3). At this time, the clockwise convection flow 90 as shown in FIG. 4A or the anticlockwise convection flow 90 as shown in FIG. 4B is generated in the field-orthogonal cross-section in the silicon melt 9 when the central magnetic field line 14C of the horizontal magnetic field is offset to the left side or right side, respectively, with respect to the center axis 3C of the quartz crucible 3A. In the present exemplary embodiment, the central magnetic field line 14C is offset to the left side to generate the clockwise convection flow 90. It should be noted that the intensity of the horizontal magnetic field applied to the silicon melt 9 in order to fix the direction of the convection flow 90 is preferably 0.6 tesla or less.

Then, the pull-up controller 20B judges whether the direction of the convection flow 90 is fixed (Step S4). When the direction of the convection flow 90 is fixed and the state shown in FIG. 6(C) is reached, the temperatures at the first and second measurement points P1, P2 are stabilized (i.e. becomes substantially constant). When the temperatures at the first and second measurement points P1, P2 are found to be stabilized, the pull-up controller 20B judges that the direction of the convection flow 90 is fixed.

Then, the convection pattern controller 20A returns the magnetic-field applying portion 14 to the center position while continuously applying the horizontal magnetic field of the intensity ranging from 0.2 tesla to 0.6 tesla (Step S5). The central magnetic field line 14C passes through the center axis 3C of the quartz crucible 3A by the process of Step S5. Subsequently, the pull-up controller 20B, which controls the rotation speed of the crucible 3, dips the seed crystal 8 into the silicon melt 9 while continuously applying the horizontal magnetic field, and then pulls up the monocrystalline silicon 10 having a straight body with a desired oxygen concentration, in accordance with the predetermined conditions (Step S6).

Meanwhile, when the temperatures at the first and second measurement points P1, P2 are not stabilized in Step S4, the pull-up controller 20B judges that the direction of the convection flow 90 is not fixed and again performs the process of Step S4 after a predetermined time.

The processes of Steps S1 to S6 described above correspond to the method of manufacturing monocrystalline silicon of the invention, and the processes of Steps S1 to S3 correspond to the method of controlling the convection pattern of the silicon melt of the invention.

It should be noted that the process of locating the magnetic-field applying portion 14 in Steps S1, S5, the process of starting application of the horizontal magnetic field in Step S3, the process of judging whether the direction of the convection flow 90 is fixed in Step S4, and/or the pull-up process in Step S6 may be performed through an operation of the operator.

Further, the pull-up controller 20B or the operator may judge the direction of the convection flow 90 based on a temperature difference between the first and second measurement points P1, P2.

[4] Operations and Effects in Exemplary Embodiment

According to the above-described exemplary embodiment, the likelihood of occurrence of the unidirectional fixation of the direction of the convection flow 90 in the field-orthogonal cross-section can be enhanced through a simple process of locating the magnetic-field applying portion 14 at the offset position to horizontally offset the pass-through position of the central magnetic field line 14C by 10 mm or more with respect to the center axis 3C of the quartz crucible 3A. Such unidirectional fixation of the direction of the convection flow 90 can restrain a variation in the oxygen concentration depending on each monocrystalline silicon 10 even when the thermal environment in the furnace of the pull-up device 1 is asymmetric.

With the offset amount D at the pass-through position of the central magnetic field line 14C, which is 15 mm or more with respect to the center axis 3C of the quartz crucible 3A, the direction of the convection flow 90 can be reliably unidirectionally fixed.

The monocrystalline silicon 10 is pulled up after the magnetic-field applying portion 14, which is once located at the offset position to unidirectionally fix the direction of the convection flow 90, is returned to the center position so that the central magnetic field line 14C passes through or near the center axis 3C of the quartz crucible 3A. Accordingly, typically employed usual pull-up conditions can be directly applied.

The monocrystalline silicon 10 is pulled up after confirming that the direction of the convection flow 90 is fixed. Accordingly, the variation in the oxygen concentration of the monocrystalline silicon 10 can be more reliably reduced.

5. Modification(s)

It should be understood that the scope of the invention is not limited by the above exemplary embodiments, but various improvements and design modifications compatible with the invention are possible.

For instance, in order to apply the horizontal magnetic field so that the central magnetic field line 14C passes through the point horizontally offset from the center axis 3C of the quartz crucible 3A, the chamber 2 or both of the chamber 2 and the magnetic-field applying portion 14 are moved in some embodiments. Alternatively, a magnetic body (referred to as a "center-position magnetic body" hereinafter) for passing the central magnetic field line 14C through the center axis 3C of the quartz crucible 3A and a magnetic body (referred to as an "offset-position magnetic body" hereinafter) for passing the central magnetic field line 14C at a position offset from the center axis 3C are provided in some embodiments, where the horizontal magnetic field is applied by the offset-position magnetic body when the direction of the convection flow 90 is fixed and is applied by the center-position magnetic body when the monocrystalline silicon 10 is pulled up.

After it is determined in Step S4 that the direction of the convection flow 90 is fixed, the magnetic-field applying portion 14 is not necessarily moved to the center position, but the monocrystalline silicon 10 is pulled up in some embodiments while the horizontal magnetic field is continuously applied and the magnetic-field applying portion 14 is retained at the offset position.

Although the plane viewed from the second magnetic body 14B (the nearby side of the sheet of FIG. 1) is exemplarily shown as the field-orthogonal cross-section, a plane viewed from the first magnetic body 14A (the far side of the sheet of FIG. 1) may be defined as the field-orthogonal cross-section for the definition of the direction of the convection flow 90.

Whether the direction of the convection flow 90 is fixed is judged in some embodiments based on the time elapsed after the horizontal magnetic field whose intensity is 0.2 tesla or more is applied to the silicon melt 9.

EXAMPLE(S)

Next, Examples of the invention will be described. It should be noted that the invention is by no means limited to Examples.

Experimental Example 1

Initially, in the pull-up device as shown in FIG. 1, the magnetic-field applying portion 14 was located at a position (center position) at which the offset amount D was 0 mm. Then, when a predetermined time passed after the quartz crucible 3A containing the silicon melt 9 was rotated, application of the horizontal magnetic field whose intensity was 0.3 tesla was started. Subsequently, after it was confirmed that the direction of the convection flow 90 was fixed, the direction of the convection flow 90 was determined based on the measurement results of the temperatures at the first and second measurement points P1, P2.

It should be noted that it is known that the direction of the convection flow 90 is fixed when 30 to 60 minutes elapse after the intensity of the horizontal magnetic field reaches 0.3 tesla. Accordingly, it was judged that the direction of the convection flow 90 was fixed when the above time elapsed.

Experimental Example 2

The same experiment as in Experimental Example 1 was conducted except that the magnetic-field applying portion 14 was moved from the center position to the right side in FIG. 2 at the offset amount D of 5 mm in order to fix the direction of the convection flow 90 anticlockwise as shown in FIG. 4B. Then, the direction of the fixed convection flow 90 was checked.

Experimental Examples 3 to 7

The same experiments were conducted as in Experimental Example 1 except that the magnetic-field applying portion 14 was moved from the center position to the right side in FIG. 2 at the offset amount D of 10 mm (Experimental Example 3), 15 mm (Experimental Example 4), 20 mm (Experimental Example 5), 25 mm (Experimental Example 6), and 30 mm (Experimental Example 7). Then, the direction of the fixed convection flow 90 in each of Experimental Examples was checked.

Evaluation

The experiments according to Experimental Examples 1 to 7 were each conducted six times, and a resultant direction of the convection flow 90 was evaluated. The results are shown in Table 1 below.

As shown in Table 1, a probability for the convection flow 90 to be fixed anticlockwise, which was less than 80% in Experimental Examples 1 to 2, was 83% in Experimental Example 3 and 100% in Experimental Examples 4 to 7. An explanation for the reason of the above results is as follows.

When the offset amount D is less than 10 mm, there is little difference between the distance from the central magnetic field line 14C to the inner periphery of the right side of the quartz crucible 3A ("right-side periphery" hereinafter) and the distance from the central magnetic field line 14C to the inner periphery of the left side of the quartz crucible 3A ("left-side periphery" hereinafter), as viewed from above. Accordingly, the restraining effect of the convection flow is substantially the same in both of the right and left sides of the central magnetic field line 14C.

Accordingly, when the downward flow is restrained at the left side with respect to the center axis 3C as shown in FIG. 6(A) by the application of the 0.01-tesla horizontal magnetic field, the first region A1 does not shift from the left side to the right side of the center axis 3C and the upward convection flow on the left side of the downward flow disappears, resulting in the anticlockwise convection flow 90. Conversely, when the downward flow is restrained at the right side with respect to the center axis 3C as shown in FIG. 7(A), the first region A1 does not shift from the right side to the left side of the center axis 3C, resulting in the clockwise convection flow 90. In other words, the fixing direction of the convection flow 90 becomes clockwise or anticlockwise depending on the timing for applying the 0.01-tesla horizontal magnetic field.

When the offset amount D to the right side is 10 mm or more, there is a large difference between the distance from the central magnetic field line 14C to the right-side periphery of the quartz crucible 3A and the distance from the central magnetic field line 14C to the left-side inner periphery of the quartz crucible 3A. Accordingly, the restraining effect of the convection flow is larger on the left side than on the right of the central magnetic field line 14C. Conversely, when the downward flow is restrained in the left side of the center axis 3C as shown in FIG. 6(A), the first region A1 does not shift from the left side to the right side of the center axis 3C, resulting in the anticlockwise convection flow 90. Further, when the downward flow is restrained at the right side with respect to the center axis 3C as shown in FIG. 7(A), the first region A1 shifts from the right side to the left side of the center axis 3C, resulting in the anticlockwise convection flow 90. In other words, the fixing direction of the convection flow 90 becomes anticlockwise irrespective of the timing for applying the 0.01-tesla horizontal magnetic field.

From the above, it was confirmed that the likelihood of fixing the direction of the convection flow 90 in a desired direction can be enhanced with the offset amount D of 10 mm or more, and the direction of the convection flow 90 could be securely fixed with the offset amount D of 15 mm or more.

TABLE 1

|  | Offset amount D | Number of clockwise rotation | Number of anticlockwise rotation | Probability of anticlockwise rotation |
| --- | --- | --- | --- | --- |
| Example 1 | 0 mm | 4 | 2 | 33% |
| Example 2 | 5 mm | 4 | 2 | 33% |
| Example 3 | 10 mm | 1 | 5 | 83% |
| Example 4 | 15 mm | 0 | 6 | 100% |
| Example 5 | 20 mm | 0 | 6 | 100% |

TABLE 1-continued

| | Offset amount D | Number of clockwise rotation | Number of anticlockwise rotation | Probability of anticlockwise rotation |
|---|---|---|---|---|
| Example 6 | 25 mm | 0 | 6 | 100% |
| Example 7 | 30 mm | 0 | 6 | 100% |

The invention claimed is:

1. A method of manufacturing monocrystalline silicon, comprising:
    applying a horizontal magnetic field having an intensity of 0.2 tesla or more to a silicon melt in a rotating quartz crucible,
    controlling a convection pattern of a silicon melt in which the horizontal magnetic field is applied so that a central magnetic field line passes through a point horizontally offset from a center axis of the quartz crucible by 10 mm or more to fix a direction of a convection flow in the silicon melt in a plane orthogonal to a direction in which the horizontal magnetic field is applied; and
    adjusting an application state of the horizontal magnetic field so that the central magnetic field line passes through the center axis of the quartz crucible, and then pulling up the monocrystalline silicon where the intensity of the horizontal magnetic field is kept at 0.2 tesla or more.

2. The method according to claim 1, wherein the point through which the central magnetic field line passes when the horizontal magnetic field is applied is offset from the center axis of the quartz crucible by 15 mm or more.

3. The method according to claim 1, wherein:
    the applying of the horizontal magnetic field includes a first fixing process for fixing the direction of the convection flow clockwise or a second fixing process for fixing the direction of the convection flow anticlockwise as viewed in a negative direction of a Y axis,
    the point for the central magnetic field line to pass through in the first fixing process being offset from the center axis of the quartz crucible in a negative direction in an X axis and the point for the central magnetic field line to pass through in the second fixing process being offset in a positive direction in the X axis,
    the X axis and Y axis being defined in a right-handed XYZ Cartesian coordinate system defining an intersection of the center axis of the quartz crucible and a center of a surface of the silicon melt as an origin, a vertically upward direction as a positive direction of a Z axis, and a direction in which the horizontal magnetic field is applied as a positive direction of the Y axis.

4. The method according to claim 1, wherein the monocrystalline silicon is pulled up after conducting the method of controlling a convection pattern of a silicon melt and the direction of the convection flow is determined to be fixed.

* * * * *